United States Patent [19]

Munter

[11] Patent Number: 5,050,195
[45] Date of Patent: Sep. 17, 1991

[54] NARROW RANGE DIGITAL CLOCK CIRCUIT

[75] Inventor: Ernst A. Munter, Kanata, Canada

[73] Assignee: Northern Telecom Limited, Montreal, Canada

[21] Appl. No.: 314,029

[22] Filed: Feb. 23, 1989

[51] Int. Cl.⁵ .............................................. H03D 3/24
[52] U.S. Cl. ................................... 375/119; 375/120; 375/81; 455/260; 328/155
[58] Field of Search ................ 375/119, 118, 120, 81, 375/; 331/1 A, 18, 25; 328/155, 72, 63, 133; 455/259, 260, 265; 377/43; 329/324, 325, 307

[56] References Cited

U.S. PATENT DOCUMENTS

| | | | |
|---|---|---|---|
| 3,102,164 | 8/1963 | Roiz | 375/120 |
| 4,575,860 | 3/1986 | Scordo | 375/119 X |
| 4,584,695 | 8/1986 | Wong et al. | 375/81 |
| 4,680,780 | 7/1987 | Agoston et al. | 375/120 |
| 4,712,225 | 12/1987 | Nelson | 331/1 A X |
| 4,821,293 | 4/1989 | Shimizume et al. | 375/81 |

Primary Examiner—Douglas W. Olms
Assistant Examiner—Ralph Smith
Attorney, Agent, or Firm—F. P. Turpin

[57] ABSTRACT

The invention provides a digital clock circuit for providing an output clock signal having a frequency varying between predetermined limits. A digital frequency changer circuit is responsive to a fixed frequency signal and to control signals for generating the output clock signal. A circuit means is responsive to a variable reference signal and to the output signal of the clock circuit for generating a binary control word representative of a frequency difference therebetween. A rate multiplier circuit is responsive to the binary control word and the output clock signal for generating the control signals. The only non-digital component of the clock circuit is a local crystal oscillator.

16 Claims, 5 Drawing Sheets

NARROW RANGE DIGITAL CLOCK CIRCUIT

FIELD OF THE INVENTION

This invention relates generally to a clock circuit and more specifically to a digital phase locked loop clock circuit in which a high speed circuit performs high speed digital operations which emulate medium speed analog components; the only non-digital component is a local crystal oscillator.

DESCRIPTION OF PRIOR ART

Phase locked loop circuits have been used for many years. Prior art phase locked loop circuits are exemplified in U.S. Pat. Nos. 4,498,059, 4,503,400, 4,748,644 and 4,724,402. They are often used in clock circuits in the receivers of digital systems for the purpose of synchronizing the local clock with the incoming data signal. In the existing circuits, a voltage controlled oscillator (VCXO) controlled by a digital to analog (D/A-converter) is used as the local clock signal and forms a part of the phase locked loop. The testing and adjustment of these analog circuits tend to add significant cost in addition to the expense of providing the additional power supplies that they typically need. Conventional prior art analog phase locked loop circuits also tend to suffer from signal drift and signal degradation due mostly to the analog components.

It is therefore an object of the invention to provide an improved phase locked loop clock circuit which eliminates the problems associated with the conventional clock circuits. The circuit of the invention does not use analog components other than a local crystal oscillator and realizes the conventional medium speed VCXO and D/A-converter functions with a high speed digital circuit. The circuit of the invention requires less printed circuit board space than the prior art circuits and no special power supplies are needed.

SUMMARY OF THE INVENTION

In accordance with the invention, there is provided a digital clock circuit for providing an output clock signal having a frequency varying between predetermined limits. The circuit comprises a first input terminal for receiving a fixed frequency signal, a second input terminal for receiving a variable reference signal and an output terminal for providing the output clock signal having substantially the same frequency as the fixed frequency signal. A digital frequency changer circuit is connected to the first input terminal and is responsive to the fixed frequency signal and to control signals for generating the output clock signal. A circuit means is responsive to the variable reference signal and to the output clock signal for generating a binary control word representative of a frequency difference therebetween, the binary control word comprising a sign bit and a plurality of other bits. A rate multiplier circuit is responsive to the binary control word and the output clock signal for generating the control signals.

From another aspect, the invention provides a method of generating an output clock signal having a frequency varying between predetermined limits in a digital clock circuit having a first input terminal for connection to a fixed frequency signal, a second input terminal for connection to a variable reference signal and an output terminal for providing the output clock signal. The method comprises the steps of receiving a fixed frequency signal on the first input terminal, receiving a variable reference signal on the second input terminal and generating a signed binary control word representative of a frequency difference between the output clock signal and the variable reference signal. Control signals having a predetermined relationship to the output clock signal and the signed binary control word are generated and the output clock signal is maintained between predetermined limits in response to the control signals thereby tracking the variable reference signal.

From yet another aspect, the method of the invention comprises the steps of receiving a fixed frequency signal on a first input terminal, receiving a variable reference signal on a second input terminal, generating control signals representative of the frequency relationship between the output clock signal and the variable reference signal and, for every cycle of the fixed frequency signal, digitally generating a cycle of the output clock signal having a similar frequency characteristic to that of the last completed cycle of the fixed frequency signal or lengthened or shortened by a fractional increment of the fixed frequency signal in dependence upon the control signals.

The present invention provides a clock circuit which is more economical than functionally equivalent prior art circuits and requires less real estate on a printed circuit board; space efficient digital components replace bulky, heavy and costly analog components of conventional prior art circuits.

BRIEF DESCRIPTION OF THE DRAWINGS

An embodiment of the invention will now be described with reference to the accompanying drawings in which.

DESCRIPTION OF THE PREFERRED EMBODIMENT

Figure 1:
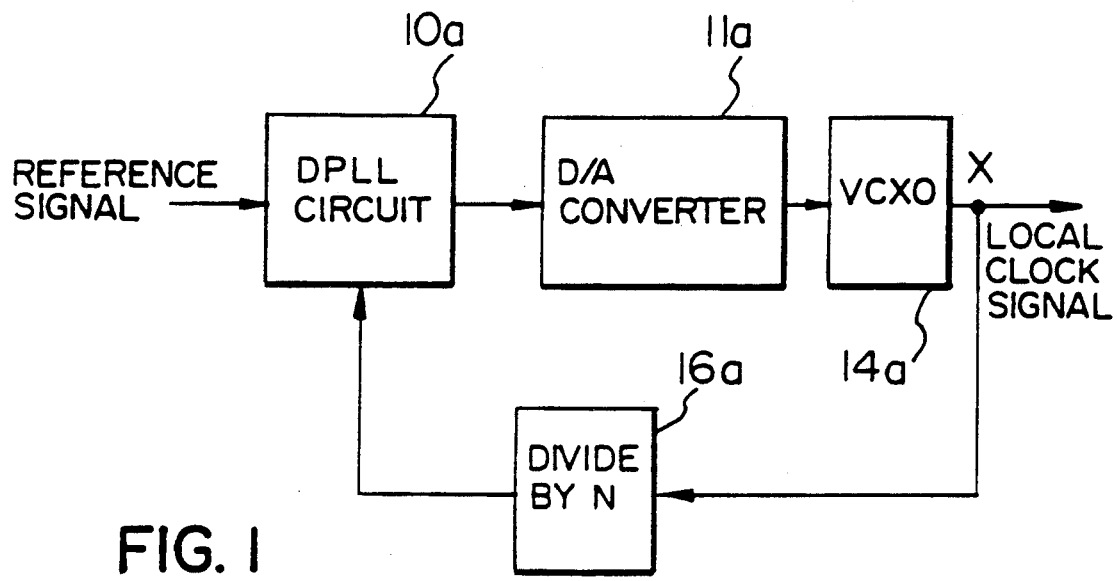
FIG. 1 is a block diagram of a typical prior art analog phase locked loop clock circuit.

Referring now to the prior art circuit of FIG. 1, a VCXO 14a is adapted to provide a local clock signal on an output terminal X for use by electronic circuitry connected to that terminal. The output signal of the VCXO is scaled using a divide by N circuit 16a and fed back to a phase comparator and DPLL algorithm circuit 10a. The circuit 10a is also connected to a variable reference signal source and is adapted to provide a signal representative of the phase relationship between the variable reference signal and the feedback scaled local clock signal to a D/A-converter 11a. The circuit 10a conventionally uses a microprocessor as its local intelligence to perform a Digital Phase Locked Loop (DPLL) algorithm on the phase difference of two incoming signals. According to present and historical phase values measured, the DPLL circuit supplies a digital value to the D/A-converter 11a which converts it to an analog voltage supplied to the VCXO 14a.

Figure 2:
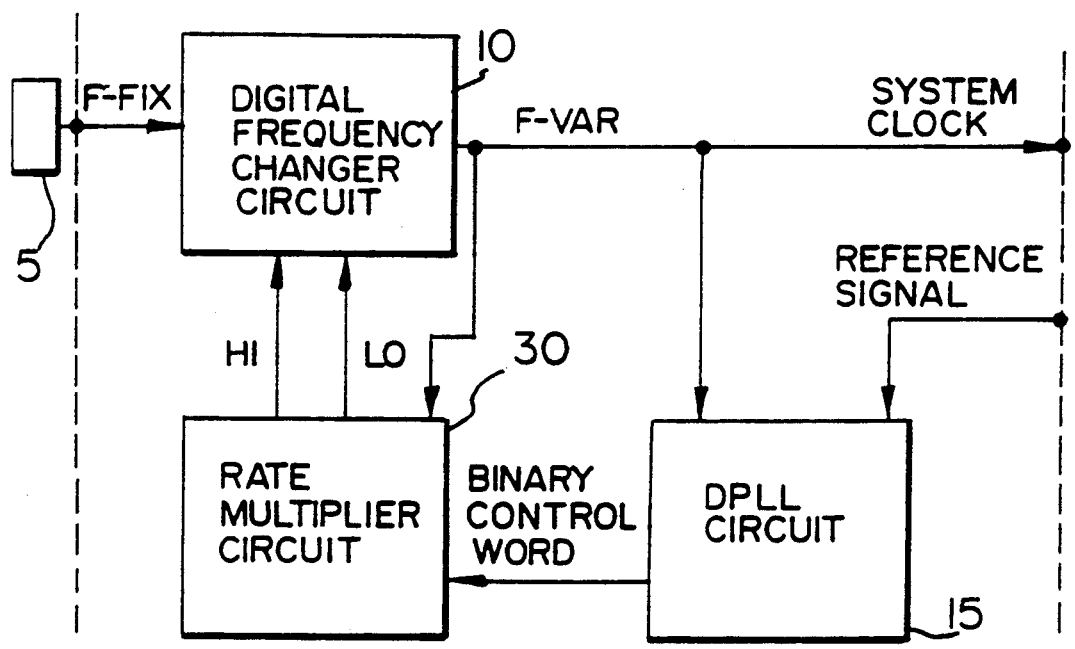
FIG. 2 is a block diagram of a digital phase locked loop clock circuit in accordance with the invention.

FIG. 2 illustrates a fully digital clock circuit in accordance with the present invention. There is shown a digital frequency changer circuit (DFC) 10 having a first input terminal connected to a fixed frequency signal source such as a crystal oscillator 5 and a pair of other input terminals respectively connected to receive HI and LO control signals from a rate multiplier circuit 30. The output terminal of the DFC 10 is connected to a system clock output terminal as well as to an input terminal of the rate multiplier circuit 30 and to a phase comparator and DPLL algorithm circuit 14. DPLL circuits are well known in the art and an example can be found in IEEE Transactions on Communications Vol. COM-31 No. 12, December 1983 in the article: "Intelligent PLL using Digital Processing for Network Synchronization" by H. Fukinuki and I. Furukawa. The DPLL circuit 50 may also be connected to a source of control signals (not shown) and to an input terminal for receiving a variable reference signal as described later. The reference signal may, for example, originate from a master clock circuit adapted to provide reference signals to a plurality of subsystems each provided with a respective clock circuit. As all signals normally do, the reference signal tends to vary between predetermined limits and it is a desired object of this circuit that the output clock signal track the reference signal while providing an output signal having a frequency substantially the same as the fixed frequency signal source.

The DFC 10 is a high speed digital circuit that performs, in a digital manner, functions that are performed with analog components in conventional clock circuits. In view of its relatively high speed requirements, this circuit may be realized with a gallium arsenide integrated circuit. The rate multiplier circuit 30 and the DPLL 15 have a lower speed requirement than the DFC 10 and may be realized using more conventional integrated circuit technology. The crystal oscillator 5 may be any conventional oscillator adapted to provide a nominal fixed frequency signal with a predetermined stability.

In operation, the DFC 10 is responsive to the fixed frequency signal F-Fix and to the HI-LO control signals to provide an output clock signal F-Var on the system clock output terminal. The F-Var signal is also applied to the DPLL circuit 15 and to the rate multiplier circuit 30. The DPLL circuit 15 is responsive to the output signal F-Var, and to the variable reference signal to provide a binary control word to the rate multiplier circuit 30. The binary control word represents the frequency difference between the fixed frequency signal and the signal F-Var. The DPLL circuit 15 integrates over time the phase difference between the signal F-Var and the variable reference signal to generate the binary control word. The rate multiplier circuit 30 is responsive to the signal F-Var and to the binary control word, to provide the control signals HI and LO to the DFC 10. Under normal operational conditions, the frequency of the F-Var signal is allowed to vary up or down but only between very narrow predetermined limits as described later. In an alternate operating mode as dictated by appropriate control signals, the DPLL circuit 15 may be controlled to operate in a test mode whereby the circuit may be exercised to ascertain that it is operating correctly.

Figure 3:
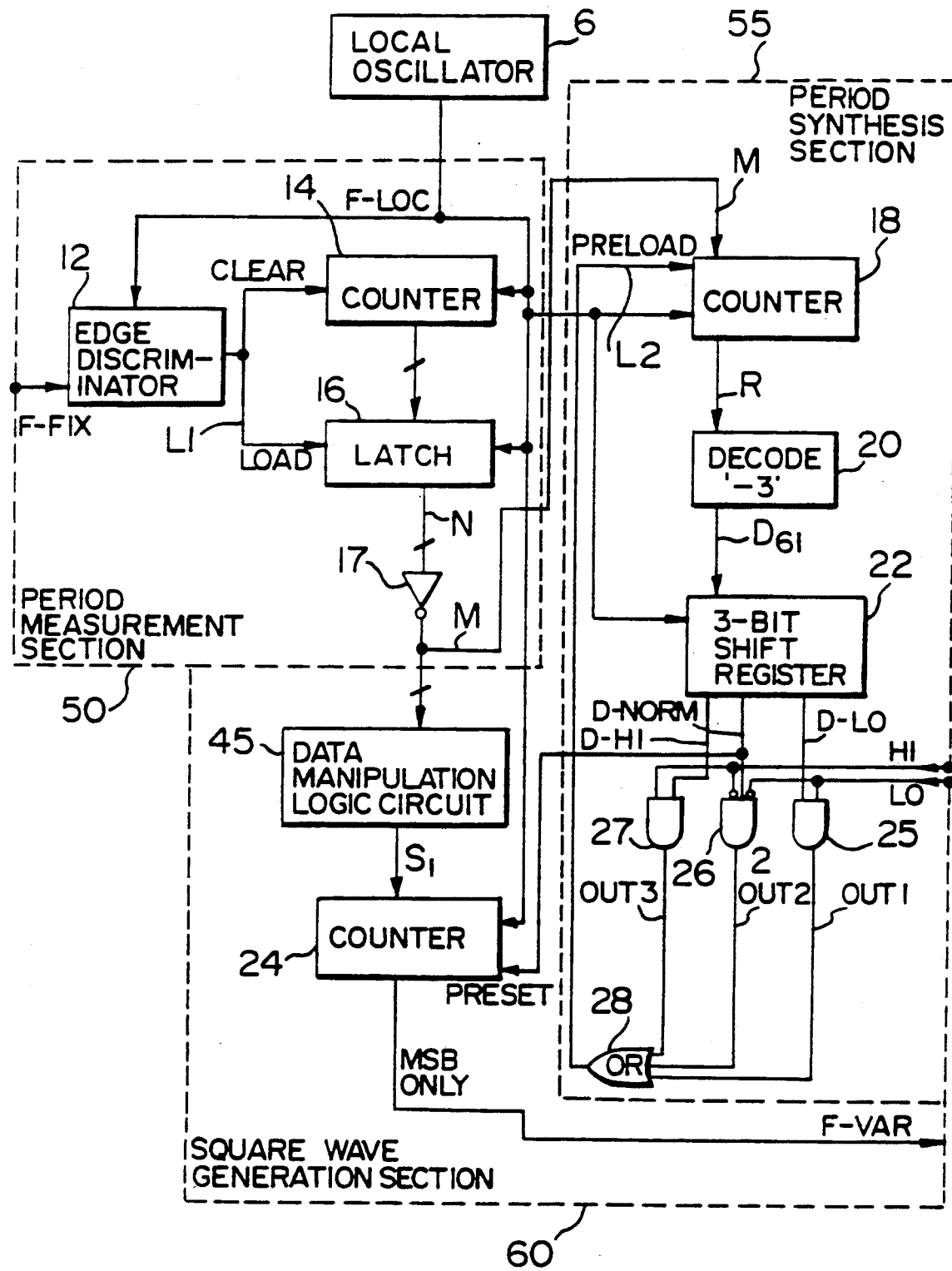
FIG. 3 is a detailed block diagram of the digital frequency changer circuit illustrated in FIG. 2.

FIG. 3 illustrates the DFC 10 and is partitioned into a period measurement section 50, a period synthesis section 55, and a square wave generating section 60 as well as a local oscillator 6 which may be a commercially available circuit adapted to provide a high frequency local clock signal F-Loc. As will become evident from the following description, the frequency of F-Loc must be selected to be much greater than the frequency of F-Fix; the granularity of frequency adjustment is dependent on the ratio of these two signals.

The period measurement section 50 includes an edge discriminator 12 having a first input terminal connected to receive the fixed frequency signal F-Fix and its output terminal connected to a counter 14 and a latch 16. The edge discriminator 12 is also connected to receive the high frequency clock signal F-Loc. The edge discriminator may conveniently be an edge sensitive triggerable flip-flop.

In operation, the period measurement circuit is responsive to the input signals F-Fix and F-Loc respectively for producing a binary value N which reflects the frequency relationship between the signals F-Fix and F-Loc, such that $N = F\text{-}Loc \div F\text{-}Fix$, where N is an integer equal or greater than 2. N may vary by 1 unit when F-Fix is not an exact submultiple of F-Loc. The edge discriminator 12 performs the synchronous differentiation of one edge of the signal F-Fix with the signal F-Loc. The output of the edge discriminator is a periodic signal which is used to reset the first counter 14 and to load the latch 16 in coincidence with the input clock signal F-Loc. The counter 14 increases its count by one unit for each period of the F-Loc clock signal and on reset, its current count is stored in the latch 16 yielding the value N. The signal M which is the bit inverse value of N is available at the output of inverter circuit 17. The input edges of the F-Fix clock pulses are sampled (quantized) to the nearest period of F-Loc, and the value N reflects the last period sampled. Of course, the counter 14 and the latch 16 must be large enough to count and store the integer N.

The period synthesis section in FIG. 3 includes a second counter 18 having an input clock signal F-Loc. The counter 18 provides a group of output signals R in response to a preload signal, the signal F-Loc and the signal M. Upon assertion of the preload signal the counter 18 loads the value M. The period synthesis section further includes a decode circuit 20 responsive to the signal R for providing a decoded output signal $D_{61}$. A 3-bit shift register 22 is responsive to the signal $D_{61}$ and to the signal F-Loc for providing the preload signal via logic gates 25, 26, 27 and 28 which are also controlled by the HI-LO control signals.

Figure 6A:
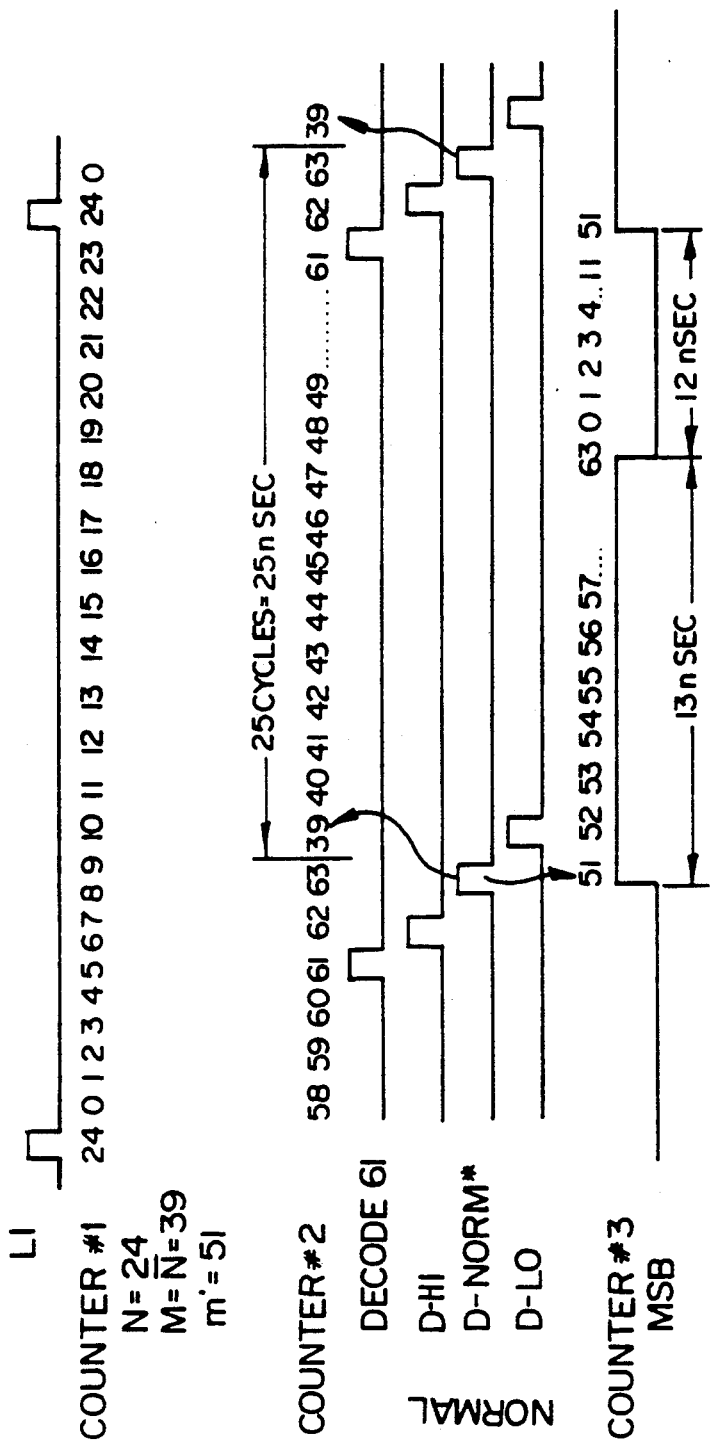
FIG. 6a is a timing diagram illustrating a first mode of operation of the circuit of FIG. 2.
Figure 6B:
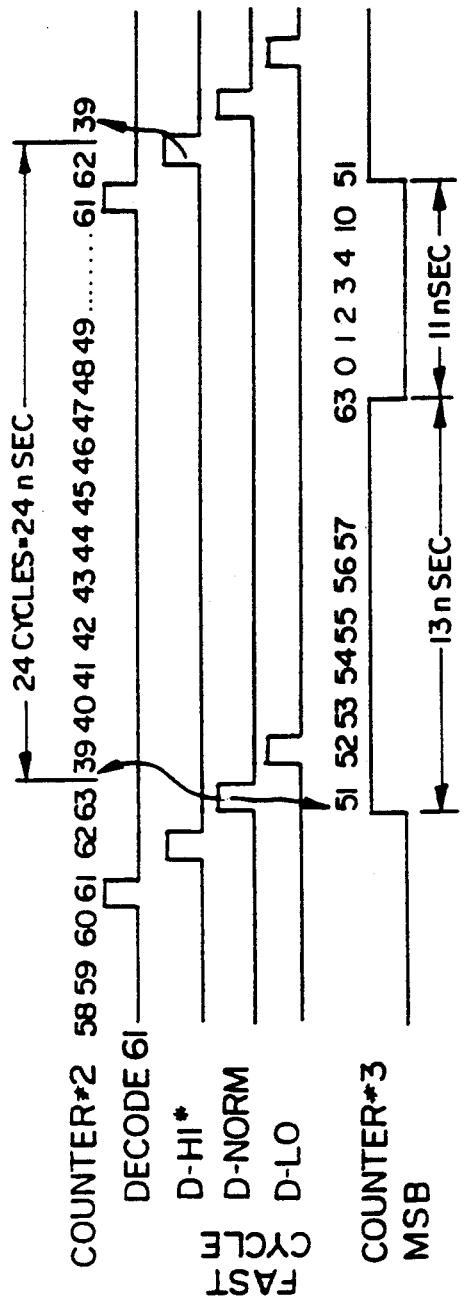
FIG. 6b is a timing diagram illustrating a second mode of operation of the circuit of FIG. 2.
Figure 6C:
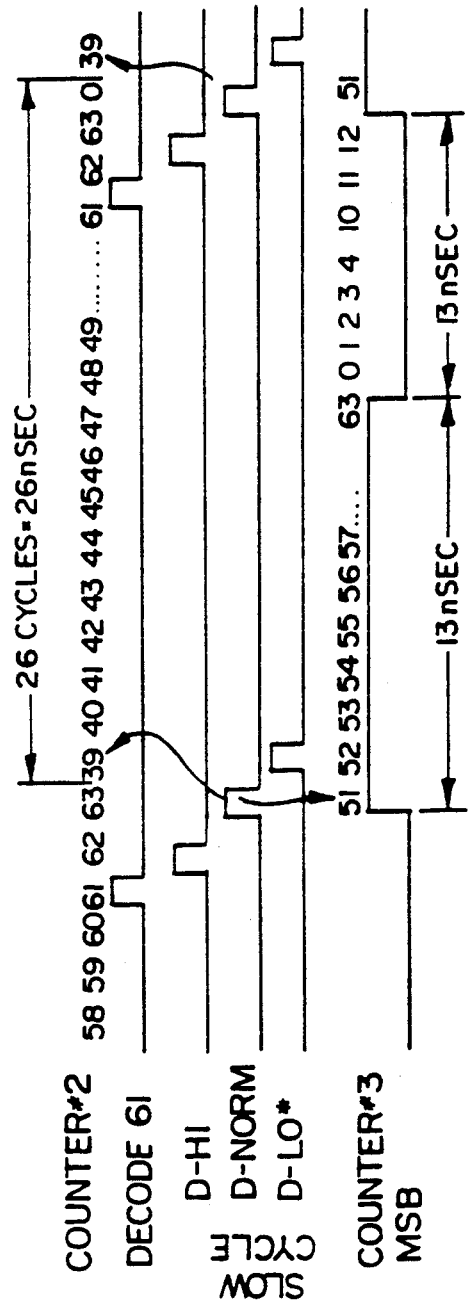
FIG. 6c is a timing diagram illustrating a third mode of operation of the circuit of FIG. 2.

In the ensuing descriptions of operation, reference may conveniently be made to FIGS. 6a, 6b, and 6c which are timing diagrams illustrating the operation of the circuit in three possible modes. In the illustrated example, the local clock signal F-Loc has a nominal frequency of one gigahertz and the F-Fix signal has a frequency of 40 megahertz. All the counters and the latch 16 are six bits wide. The amount of jitter that is present on the output clock signal F-Var is inversely proportional to the signal F-Loc.

In operation, the second counter 18 counts input clock pulses F-Loc but is preset to a value M which is the bit inverse of N. The counter 18 resets itself each time it reaches a full count. The decode circuit 20 is responsive to the output signals R of the second counter 18 to provide an output signal $D_{61}$ which anticipates a full count of the second counter 18 by three clock cycles. For example the decode value of '−3' (equivalent to a value of 61 or the binary value 111101 using 6-bit registers and counters) provides the 3-bit shift register 22 with the input signal $D_{61}$ from the decoder 20 which is three clock cycles early. The 3-bit shift register 22 thus provides three output signals D-LO, D-NORM and D-HI which are delayed one, two and three clock cycles respectively, relative to the output signal $D_{61}$ of the decode circuit 20. The D-NORM signal corresponds to the desired nominal frequency of the output clock signal F-Var. It also serves as the preset input to the output stage of the DFC 10. The choice of using D-NORM as the preset input is arbitrary and either of the signals D-LO or D-HI can also be used instead of D-NORM. The gate 25 has an output signal OUT1 corresponding to a logical AND operation performed on its input signals D-LO and the control signal LO (D-LO·LO). Gate 26 has an output signal OUT2 corresponding to a logical AND operation performed on its input signals D-NORM, and the control signals HI and LO both inverted (D-NORM·$\overline{HI}$·$\overline{LO}$). The gate 27 has an output signal OUT3 corresponding to a logical AND operation performed on its input signals D-HI and the control signal HI (D-HI·HI). The OR gate 28 is responsive to the output signals OUT1, OUT2, and OUT3 to provide the preload signal to the counter 18. As illustrated in FIGS. 6a, 6b, and 6c the selection of D-HI, D-NORM or D-LO results in the generation of the output signal F-Var with a period shorter, the same or longer than F-Fix. Varying the synthesized period by ±1 from nominal, effectively moves an output edge forward or backward by 1 nsec (given the example of a 1Ghz local oscillator). Thus, selecting D-NORM and occasionally varying D-HI or D-LO for one cycle of the counter, effects an arbitrarily small effective frequency offset from F-Fix, yet still not introducing more than 1 nanosecond of jitter in the output signal F-Var.

Figure 4:
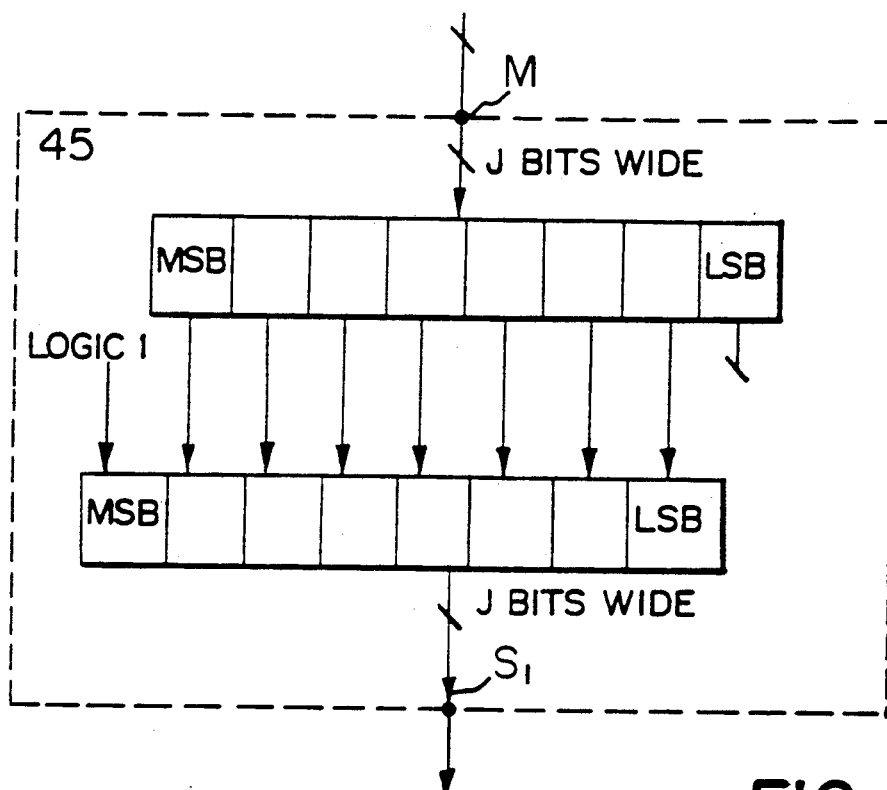
FIG. 4 is a detailed block diagram of the data manipulation circuit illustrated in FIG. 3.

The square wave generation section 60 includes a data manipulation logic circuit 45 responsive to the input signals M, to provide an output signal S1 to a third counter 24. As shown in FIG. 4, the data manipulation circuit 45 may be realized using a pair of registers interconnected as illustrated. The circuit 45 manipulates the input signal M (J bits wide) first by dropping the least significant bit (LSB) to generate a signal which is J−1 bits wide. A signal having the value of logic 1 is then concatenated at the most significant bit position (MSB) with that signal to yield a new mapped signal $S_1$ which is also J bits wide. For example if J=6 and M=110001, dropping the LSB yields 11000 and concatenating a 1 to the MSB yields 111000.

The counter 24 has an output terminal that corresponds to its most significant stage and is responsive to the clock input signal F-Loc, and to the preset signal from shift register 22 to generate the square wave output signal F-Var.

Figure 5:
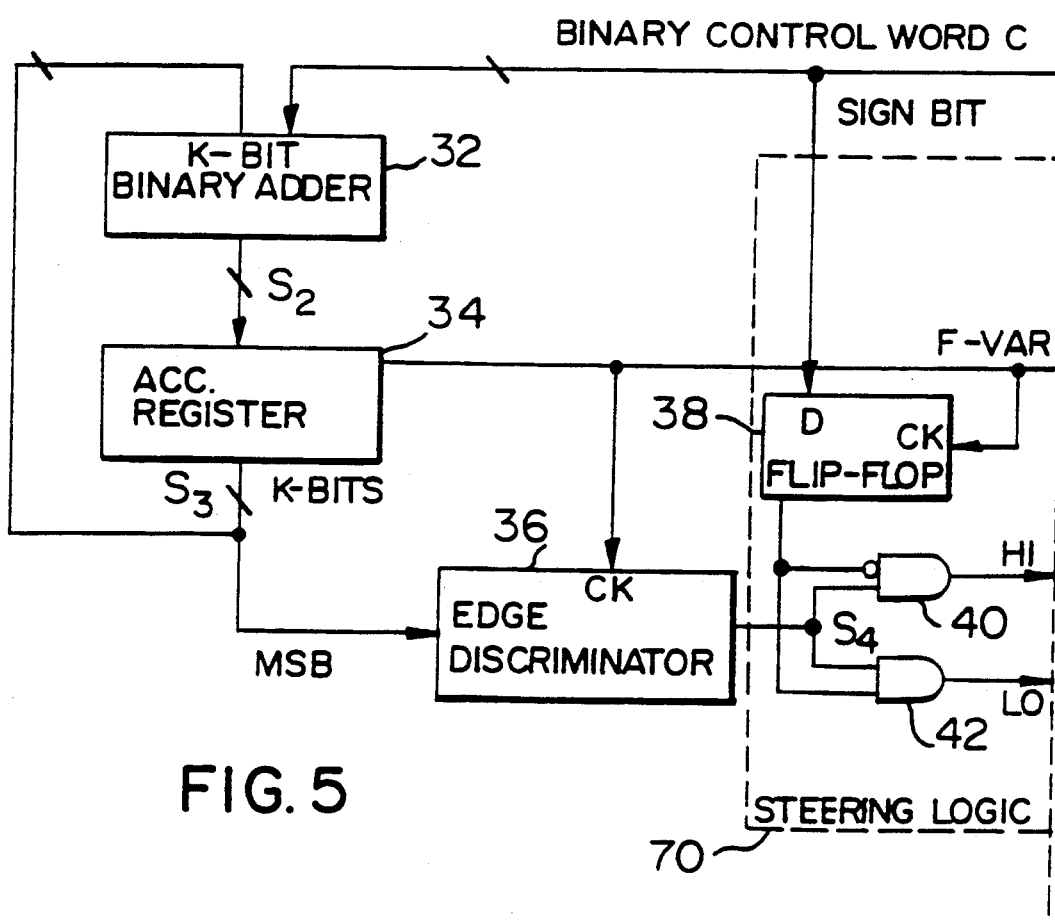
FIG. 5 is a detailed block diagram of the rate multiplier circuit illustrated in FIG. 2.

FIG. 5 illustrates the medium speed rate multiplier circuit 30 of FIG. 2. It includes a binary adder 32, an accumulator register 34, an edge discriminator 36 and steering logic 70. These circuit elements may be realized using commercially available off-the-shelf components. The multiplier circuit converts a signed binary control word C from the DPLL circuit 15 into evenly spaced HI or LO pulses. The binary k-bit adder 32 provides an output signal $S_2$ comprised of a plurality of bits (k-bits, the kth bit being the most significant bit) in response to signal $S_3$ and the control word C comprised of a 2's complement k-bit control word exclusive of the sign bit. The accumulator register 34 is responsive to the clock input signal F-Var and to the output signal $S_2$ of the binary adder 32 to generate the k-bit output signal $S_3$. The edge discriminator 36 is responsive to the clock input signal F-Var and to a one bit wide input signal comprising the kth bit of the group of signals $S_3$ of the accumulator register 34 to provide a control signal $S_4$ corresponding to the differentiated kth bit of the accumulator output signal $S_3$. The output signal $S_4$ is a pulse occurring at the rate of the absolute value of C pulses in $2^{**}k$ clock periods. This pulse is directed to the HI or LO inputs of the DFC circuit 10 via the steering logic 70. Depending on the sign bit of signal C, the steering logic 70 asserts one of the HI and LO signals using gates 40, and 42. For example, with the value of C=0, the accumulator value does not change, and HI or LO pulses are not generated and F-Var=F-Fix. With a 16 bit accumulator and the value of C=3, the sign bit being positive, three pulses occur in 64 k pulses occur at the Hi output terminal. When C=−1, one pulse in 64 k clocks occurs at the LO output terminal. With a 1Ghz local oscillator F-Loc and with an incoming clock signal F-Fix=40Mhz, F-Var=F-Fix±0.625 ppm (parts per million), a step size comparable to that obtained with the counterpart analog solution for stratum 4 clocks using a D/A converter and a VCXO.

Numerous modifications, variations and adaptations may be made to the particular embodiment of the invention described above without departing from the scope of the claims.

What is claimed is:

1. A digital clock circuit for generating an output clock signal having a frequency varying between predetermined limits, the circuit comprising:
   a first input terminal for receiving a fixed frequency signal and an output terminal for providing the output clock signal;
   a second input terminal for receiving a reference signal;
   a digital frequency changer circuit connected to the first input terminal and responsive to the fixed frequency signal and to control signals for controlling the frequency of the output clock signal;
   a measurement circuit responsive to the reference signal and to the output clock signal for generating a signed binary control word representative of a frequency difference therebetween; and
   a rate multiplier circuit responsive to the binary control word and the output clock signal for generating the control signals, the latter corresponding to an increase or decrease in the frequency of the output clock signal;
   the digital frequency changer circuit including oscillator means for providing a high frequency local clock signal and comprising circuit mans for periodically adjusting the frequency of the output clock signal by one increment that causes it to approach the same frequency as that of the reference signal, each increment corresponding to zero, or plus one, or minus one cycle of thee local clock signal.

2. A digital clock circuit as defined in claim 1 wherein the circuit means comprises, a period measurement circuit for providing signals corresponding to the period of the fixed frequency signal, a synthesis circuit responsive to the period measurement circuit signals and to the control signals for producing a preset control signal, and a square wave signal generating circuit responsive to the period measurement circuit output signals and to the preset control signal for generating the output clock signal.

3. A digital clock circuit as defined in claim 2 wherein the oscillator means for providing a local clock signal has a frequency at least twice the frequency of the fixed frequency signal, the period measurement circuit further comprising a first counter means, a means for storing the content of the first counter and an edge discriminator responsive to the fixed frequency signal and the local clock signal for providing a clear signal to the first counter and a load signal to the first counter output storing means, and the storing means, the output signals of the inverter means corresponding to the period measurement circuit output signals.

4. A digital clock circuit as defined in claim 3 wherein the synthesis circuit comprises a second counter and a look ahead circuit responsive to output signals of the second counter and to the control signals for providing an output signal which is one of, coincident with a full count of the second counter, advanced by one count of a full count of the second counter, and delayed by one count of a full count of the second counter, the second counter being responsive to the local clock signal and the output signal of the look ahead circuit for loading the period measurement circuit output signals.

5. A digital clock circuit as defined in claim 4 wherein the look ahead circuit comprises a decoder circuit for generating an output signal comprising a three bit binary word corresponding to the three least significant positions of a predetermined binary value of the output signals of the second counter, the binary value being representative of a count that is three counts less than a full period of the second counter.

6. A digital clock circuit as defined in claim 5 wherein the look ahead circuit further comprises a three stage shift register responsive to the output signal of the decoder circuit and to the local clock signal for generating output signals each corresponding to a respective stage thereof, and logic gates responsive to the control signals and to the output signals of the shift register for providing the output signal of the look ahead circuit.

7. A digital clock circuit as defined in claim 6 wherein the square wave generating circuit comprises a data manipulation logic circuit responsive to the period measurement circuit output signals for providing output signals which are mapped to the period measurement circuit output signals by dropping the least significant bit thereof and concatenating a logic 1 bit in the most significant bit position thereof, and comprising a third counter responsive to the mapped signals, to the output signal from the look-ahead circuit, and to the local clock signal for providing the output clock signal from the last stage of the counter.

8. A digital clock circuit as defined in claim 7 wherein the data manipulation logic circuit comprises two parallel sets of gates, the output terminals of the input set of gates being connected to the input terminals of the output set of gates but offset by one position towards the least significant position, the input terminal of the gate at the most significant position of the output set of gates being connected to a source of logic 1 bits.

9. A digital clock circuit as defined in claim 1 wherein the rate multiplier circuit comprises a k-bit summing means for providing a k-bit output signal in response to the output clock signal, the k-bit output signal and binary control word exclusive of the sign bit, an edge discriminator responsive to the kth bit of the output signal of the summing means and the output clock signal for providing a first control signal, the rate multiplier circuit further comprising a steering circuit responsive to the first control signal, the output clock signal and the sign bit of the binary control word for providing the control signals.

10. A method of maintaining the frequency of an output clock signal between predetermined limits in a digital clock circuit having a first input terminal for connection to the fixed frequency signal, a second input terminal for connection to a reference signal and an output terminal for providing the output clock signal, comprising the steps of:

receiving the fixed frequency signal on the first input terminal;

receiving a reference signal on the second input terminal;

generating a signed binary control word representative of a frequency difference between the fixed frequency signal and the variable reference signal;

converting the signed binary word into control signals; and controlling in a digital manner, the frequency of the output clock signal in response to the control signals and to the fixed frequency signal wherein the controlling step comprises the steps of:

generating a binary word which has a value representative of the ratio of the period of the fixed frequency signal having a predetermined frequency $f_1$, to the period of a local clock signal having a predetermined frequency $f_2$, wherein $f_2$ is much higher than $f_1$, and generating a value N, wherein $f_2/f_1 = N$;

generating a preset pulse which repeats itself after a time period equal to one of $(N-1)/f_2$ seconds, in dependence upon the binary word and the control signals; and for every cycle of the output clock signal and in dependence upon the preset pulse and the binary word, generating an output clock signal having a period which is the same as the period of the previous cycle of the output clock signal or which is greater or smaller than the period of the previous cycle of the output clock signal by an amount corresponding to one local clock period.

11. A method of maintaining the frequency of an output clock signal within predetermined limits as defined in claim 10 wherein the step of generating a binary word comprises the steps of:

discriminating one edge of the fixed frequency signal with the local clock signal to produce a first counter-latch control signal pulse having a period coincident with the fixed frequency signal; and generating the first binary word by incrementally counting the number of periods of the local clock signal that occur in each period of the counter-latch control signal pulse.

12. A method of maintaining the frequency of an output clock signal within predetermined limits as defined in claim 10 wherein the step of generating the preset pulse comprises the steps of:

generating a second binary word having a predetermined maximum value representative of the fixed frequency signal shifted in phase within predetermined limits in dependence upon the control signals, by incrementally counting with an edge of the local clock signal, in dependence upon the binary signal which provides a seed value from which to start the count;

generating a look ahead signal pulse occurring before the maximum count of the second binary value for providing a signal representative of a value less than the maximum count of the second binary value;

generating three signals representative of the look ahead signal pulse shifted by one, two and three local clock cycles respectively for combining with the control signals, the signal shifted by two local clock cycles being the normal pulse.

13. A method of maintaining the frequency of an output clock signal within predetermined limits as defined in claim 10 wherein the step of generating the output clock signal comprises the steps of:

performing data manipulations on the binary word having k bits by dropping the least significant bit thereof and concatenating a logic 1 to the most significant bit position thereof, thereby generating a k-bit binary signal whose value corresponds to half the period of the fixed frequency signal, and incrementally counting with an edge of the local clock signal, each counting sequence beginning from a seed value corresponding to the k-bit binary signal upon the assertion of the normal pulse.

14. A method of maintaining the frequency of an output clock signal between predetermined limits in a digital clock circuit, comprising the steps of:

receiving a fixed frequency signal having a frequency $f_1$ on one input terminal;

receiving a local clock signal having a frequency $f_2$ on another input terminal, wherein $f_2/f_1 = N$, wherein $N > 1$; and generating the output clock signal having a frequency that is faster, slower or the same as the fixed frequency signal, the faster frequency being $f_2/(N-1)$, the slower frequency being $f_2/(N+1)$, in dependence upon control signals, the control signals representing a request for an upwards or downwards frequency change.

15. A method of maintaining the frequency of an output clock signal between predetermined limits in a digital clock circuit having a first input terminal for connection to the fixed frequency signal, a second input terminal for connection to a reference signal and an output terminal for providing the output clock signal, comprising the steps of:

receiving the fixed frequency signal on the first input terminal;

receiving a reference signal on the second input terminal;

in response to the frequency difference between the fixed frequency signal and the reference signal, generating control signals corresponding to an increase or decrease in the frequency of the output clock signal;

controlling n a digital manner, the frequency of the output clock signal in response to the control signals and to the fixed frequency signal, the controlling step including the steps of:

measuring the period of the fixed frequency signal in increments corresponding to the period of a local clock signal having a frequency at least twice the frequency of the fixed frequency signal; and synthesizing the fixed frequency signal in response to the value of the measured period and to the control signals by generating an output clock signal which is one of coincident with the measured period of the fixed frequency signal, advanced by one period of the local clock signal, and delayed by one period of the local clock signal.

16. A digital clock circuit for generating an output clock signal having a frequency varying between predetermined limits, the circuit comprising:

a first input terminal for receiving a fixed frequency signal and an output terminal for providing the output clock signal;

a second input terminal for receiving a reference signal;

a control circuit responsive to the reference signal and to the output clock signal for generating control signals corresponding to an increase or decrease in the frequency of the output clock signal; and a digital frequency changer circuit for controlling the frequency of the output clock signal, the changer circuit comprising a period measurement circuit responsive to a local clock signal having a frequency substantially greater than the frequency of the fixed frequency signal for measuring the period of the fixed frequency signal, and a synthesis circuit responsive to the value of the measured period and to the control signals for generating an output clock signal which is one of coincident with the measured period of the fixed frequency signal, advanced by one period of the local clock signal, and delayed by one period of the local clock signal.

* * * * *